(12) United States Patent
Nehrke et al.

(10) Patent No.: US 9,977,106 B2
(45) Date of Patent: May 22, 2018

(54) MR IMAGING WITH $B_1$ MAPPING

(71) Applicant: KONINKLIJKE PHILIPS N.V., Eindhoven (NL)

(72) Inventors: Kay Nehrke, Ammersbek (DE); Peter Boernert, Hamburg (DE); Ingmar Graesslin, Boenningstadt (DE); Ulrich Katscher, Norderstedt (DE); Christoph Leussler, Hamburg (DE); Holger Eggers, Ellerhoop (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 963 days.

(21) Appl. No.: 14/371,887

(22) PCT Filed: Jan. 4, 2013

(86) PCT No.: PCT/IB2013/050084
§ 371 (c)(1),
(2) Date: Jul. 11, 2014

(87) PCT Pub. No.: WO2013/105006
PCT Pub. Date: Jul. 18, 2013

(65) Prior Publication Data
US 2015/0002149 A1    Jan. 1, 2015

Related U.S. Application Data

(60) Provisional application No. 61/585,726, filed on Jan. 12, 2012, provisional application No. 61/708,115, filed on Oct. 1, 2012.

(30) Foreign Application Priority Data

Jan. 12, 2012  (EP) .................................... 12150929

(51) Int. Cl.
*G01R 33/50*  (2006.01)
*G01R 33/24*  (2006.01)
*G01R 33/54*  (2006.01)

(52) U.S. Cl.
CPC ........... *G01R 33/50* (2013.01); *G01R 33/243* (2013.01); *G01R 33/246* (2013.01); *G01R 33/54* (2013.01)

(58) Field of Classification Search
USPC ......................................... 324/309, 308, 317
See application file for complete search history.

(56) References Cited

U.S. PATENT DOCUMENTS 4,983,921 A    1/1991  Kramer
5,378,985 A    1/1995  Hinks
(Continued)

OTHER PUBLICATIONS

Nehrke, Kay et al "Fast B1 Mapping using a STEAM-Based Bloch-Siegert Preparation Pulse", Proc. ISMRM, vol. 19, 2011, pp. 4411.
(Continued)

*Primary Examiner* — Vincent Q Nguyen

(57) ABSTRACT

In an MR imaging method and apparatus, a portion of a body placed in an examination volume of an MR device is subjected to an imaging sequence of RF pulses and switched magnetic field gradients. The imaging sequence is a stimulated echo sequence including i) two preparation RF pulses (α) radiated toward the portion of the body during a preparation period (21), and ii) reading RF pulses (β) radiated toward the portion of the body during an acquisition period (22) temporally subsequent to the preparation period (21). FID signals ($I_1$) and stimulated echo signals ($I_2$) are acquired during the acquisition period (22) with equal $T_2^*$-weighting. A $B_1$ map indicating a spatial distribution of the RF field of the preparation RF pulses within the portion of the body is (Continued)

derived from the acquired FID ($I_1$) and stimulated echo ($I_2$) signals.

24 Claims, 5 Drawing Sheets

(56) References Cited

U.S. PATENT DOCUMENTS

| | | | |
|---|---|---|---|
| 8,077,955 | B2 | 12/2011 | Dannels et al. |
| 8,198,891 | B2 | 6/2012 | Sacolick et al. |
| 8,736,265 | B2 | 5/2014 | Boernert |
| 2007/0145975 | A1* | 6/2007 | Feiweier ............ G01R 33/583 324/307 |
| 2010/0237861 | A1 | 9/2010 | Hennel |
| 2011/0001476 | A1 | 1/2011 | Morrell |
| 2011/0133736 | A1* | 6/2011 | Zhong ............ G01R 33/5607 324/309 |
| 2014/0037171 | A1* | 2/2014 | Bhat .................. G06T 11/003 382/131 |
| 2014/0050715 | A1* | 2/2014 | Fernandez-Ruemann ............... A23L 1/3053 424/94.61 |
| 2014/0117987 | A1 | 5/2014 | Yui |

OTHER PUBLICATIONS

Helms, G. et al "Rapid Radiofrequency Field Mapping in Vivo using Single-Shot STREAM MRI", Magnetic Resonance in Medicine, vol. 60, 2008, pp. 739-743.

Counsell, C.J.R. "Stimulated Echoes and Spin Echoes, Simultaneaous Determination of T2, Diffusion Coefficient and RF Homogeneity", Journal of Magnetic Resonance, vol. B101, 1993, pp. 28-34.

Eggers, Holger et al "Dual-Echo Dixon Imaging with Flexible Choice of Echo Times", Magnetic Resonance in Medicine, 2011, vol. 65, pp. 96-107.

Setsompop, K. et al "Magnitude Least Squares Optimization for Parallel Radio Frequency Excitation Design Demonstrated at 7 Tesla with Eight Channels", Magnetic Resonance in Medicine, 2008, vol. 59, pp. 908-915.

Berglund, Johan, et al "Two-Point Dixon Method with Flexible Echo Times", Magnetic Resonance in Medicine, vol. 65, 2011, pp. 994-1004.

Hennig, Juergen "Echoes—How to Generate, Recognize, use or Avoid them in MR-Imaging Sequences", Part I: Fundamental and Not so SUndamental Properties of Spin Echoes, Concepts in Magnetic Resonance, Apr. 1991, vol. 3, pp. 125-143.

Zur, Y. et al "Spoiling of Transverse Magnetization in Steady-State Sequences", Magnetic Resonance in Medicine, vol. 21, 1991, pp. 251-263.

Nehrke, Kay et al "DREAM—A Novel Approach for Robust, Ultrafast Multislice B1 Mapping", Magnetic Resonance in Medicine, 2012, vol. 68, No. 5, pp. 1517-1526.

Woessner, D.E. "Effects of Diffusion in Nuclear Magnetic Resonance Spin-Echo Experiments", The Journal of Chemical Physics, vol. 34, No. 6, Jun. 1961. pp. 2057-2061.

Kingsley, Peter B. "Product Operators, Coherence Pathways, and Phase Cycling. Part II. Coherence pathways in Multipulse Sequences: Spin Echoes, Stimulated Echoes, and Multiple-Quantum Coherences", Concepts in Magnetic Resoance, Vo. 7, Jan. 1995, pp. 115-136.

Scheffler, Klaus "A Pictorial Description of Steady-States in Rapid Magnetic Resonance Imaging", Concepts in Magnetic Resonance, vol. 11, Jan. 1999, pp. 291-304.

Harvey, P.R. et al "SAR Behavior duing WHole-Body Multitransmit RF Shimmiong at 3.0T", Pr0c. Intl. Society for Magnetic Resonance in Medicine, vol. 17, 2009, pp. 4786.

Van Gelderen, P. et al Real-Time Shimming to COmpensate for Respiration-Induced B0 Fluctuations, Magnetic Resonance in Medicine, vol. 57, No. 2, Jan. 2007, pp. 362-368.

Schar, M. et al "Simultaneous B0- and B1 Map Acquisition for Fast Localized Shim, Frequency and RF Power Determination in the Heart at 3T", Intl. Society for Magnetic Resonance in Medicine, No. 16, 2008, pp. 358.

Witschey, W.R. et al "Simultaneous B1 and B0 Mapping at 7T", Proc. Intl. Society for Magnetic Resonance in Medicine, Jan. 2010.

Pan, Jullie W. et al "Quantitative Spectroscopic Imaging of the Human Brain", Magnetic Resonance in Medicine, vol. 40, Jan. 1998, pp. 363-369.

Tofts, Paul S. "The Measurement Process: MR Data Collection and Image Analysis", Quantitative MRI of the Brain; Measuring Changes Caused by Disease, jan. 2003, pp. 17-54.

Malik, S.J. et al "Steady-State B1 Mapping of Dynamically Changing RF Fields", Proc. Intl. Society for Magnetic Resonance in Medicine, vol. 19, Jan. 2011, pp. 645.

Nehrke, Kay et al "Improved B1-Mapping for Multi RF Transmit Systems", Proc. Intl. Society for Magnetic Resonance in Medicine, 2008, pp. 353.

Akoka, S. et al "Radiofrequency Map of an NMR Coil by Imaging", Magnetic Resoance Imaging, vol. 11, No. 3, Jan. 1993, pp. 437-441.

Katscher, Ulrich et al "In Vivo B1-Based SAR Determination in a Multi-Transmit System with DREAM" Proc. Intl. Society for Magnetic Resonance in Medicine, vol. 20, May 2012, pp. 2733.

Nehrke, Kay et al "Free-Breathing Abdominal B1 Mapping at 3T using the DREAM Approach", Proc. Intl. Society for Magnetic Resonance in Medicine, vol. 20, May 2012, pp. 3356.

* cited by examiner

MR IMAGING WITH B₁ MAPPING

CROSS-REFERENCE TO PRIOR APPLICATIONS

This application is the U.S. National Phase application under 35 U.S.C. § 371 of International Application No. PCT/IB2013/050084, filed on Jan. 4, 2013, which claims the benefit of U.S. Provisional Patent Application No. 61/585,726, filed on Jan. 12, 2012, U.S. Provisional Patent Application No. 61/708,115, filed on Oct. 1, 2012 and European Patent Application No. 12150929.3, filed on Jan. 12, 2012. These applications are hereby incorporated by reference herein.

The invention relates to the field of magnetic resonance (MR) imaging. It concerns methods of MR imaging of at least a portion of a body. The invention also relates to a MR device and to a computer program to be run on a MR device.

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field ($B_0$ field) whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field, also referred to as $B_1$ field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of one or more receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, linear magnetic field gradients extending along the three main axes are superposed on the uniform magnetic field, leading to a linear spatial dependency of the spin resonance frequency. The signal picked up in the receiving coils then contains components of different frequencies which can be associated with different locations in the body. The MR signal data obtained via the RF coils corresponds to the spatial frequency domain and is called k-space data. The k-space data usually includes multiple lines acquired with different phase encoding. Each line is digitized by collecting a number of samples. A set of k-space data is converted to a MR image by means of Fourier transformation.

It is generally desirable to have a relatively uniform homogeneity of the generated transmit RF field ($B_1^+$ field) for excitation of magnetic resonance throughout a cross section and/or a volume of the imaged patient's body. However, as the MR frequency increases, with increasing main magnetic field strength, this becomes more difficult due to conductive losses and wavelength effects within the body of the patient. Consequently, an accurate measurement of the spatial distribution of the transmitted RF field is important for many MR imaging applications to support appropriate prospective (if applicable) and retrospective correction/compensation. This requires a robust and fast $B_1$ mapping technique.

K. Nehrke and P. Boernert (Proc. ISMRM 19, 2011, page 4411) have proposed a $B_1$ mapping technique using a STEAM-based Bloch-Siegert preparation pulse. Unlike conventionally applied double-angle or other signal magnitude-based methods, it encodes the $B_1$ information into MR signal phase, which results in important advantages in terms of acquisition speed, accuracy and robustness. According to the known technique, a Bloch-Siegert $B_1$ mapping approach is combined with a stimulated echo (STEAM) sequence for MR imaging. The off-resonant Bloch-Siegert RF pulse is applied during the preparation period of the stimulated echo sequence, i.e. between the two on-resonant preparation RF pulses. In this way, the Bloch-Siegert phase shift, which is due to $B_1$ inhomogeneity, is stored along the longitudinal axis. A fast readout of multiple stimulated echoes is enabled by means of the reading RF pulses applied during the acquisition period of the sequence. The main advantage of this known approach is that the SAR level can be kept low. Moreover, the stimulated echo sequence is inherently robust with respect to chemical shift and susceptibility artefacts, thus facilitating advanced acquisition schemes like EPI.

However, a drawback of the known STEAM-based Bloch-Siegert preparation sequence is that the determination of the $B_1$ map is based on two separate repetitions, wherein MR signals are acquired with a positive and negative frequency offset of the Bloch-Siegert RF pulse, respectively. This requirement is problematic in abdominal $B_1$ mapping because peristaltic motion results in phase shifts between successive repetitions of the sequence. This dual repetition necessity holds also true for $B_1$ mapping approaches based on the pure STEAM sequence, in which a STEAM sequence is performed twice using different flip angles for magnetization preparation (see: Helms G, Finsterbusch J, Weiskopf N, Dechent P. Rapid radiofrequency field mapping in vivo using single-shot STEAM MRI. Magn. Reson. Med. 2008; 60:739-43.).

The paper '*Stimulated echoes and spin echoes. Simultaneous determination of T2, diffusion coefficient and RF homogeneity*' in J. Magn. Res. B101 (1993) 28-34 by C. J.

R. Counsell mentions that spatial homogeneity of the flip angle and hence in the B1-field from combinations of echo signals. However, this known approach requires a full refocusing pulse after each read-out of the echo signals.

The need for repetition leads to erroneous $B_1$ maps. In addition, the time interval between two separate repetitions required for $T_1$ relaxation may be in the order of several seconds, and hence, may lead to an excessive scan time increase. Moreover, the stimulated echo preparation pulses of the known sequence themselves exhibit a strongly non-linear flip-angle behavior. This disadvantageously limits the dynamic range of the known $B_1$ mapping approach.

From the foregoing it is readily appreciated that there is a need for an improved $B_1$ mapping method.

In accordance with the invention, a method of MR imaging of at least a portion of a body placed in the examination volume of a MR device is disclosed. The method comprises the steps of:

subjecting the portion of the body to an imaging sequence of RF pulses and switched magnetic field gradients, which imaging sequence is a stimulated echo sequence including:

i) at least two preparation RF pulses radiated toward the portion of the body during a preparation period, and ii) one or more reading RF pulses radiated toward the portion of the body during an acquisition period temporally subsequent to the preparation period;

acquiring one or more FID signals and one or more stimulated echo signals during the acquisition period; and deriving a $B_1$ map indicating the spatial distribution of the RF field of the RF pulses within the portion of the body from the acquired FID and stimulated echo signals. It is the gist of the invention to apply one or more reading RF pulses during the acquisition period of the stimulated echo sequence, wherein the FID signals and the stimulated echo signals are acquired quasi-simultaneously. A MR image can be reconstructed from the FID signals and another MR image can be reconstructed from the stimulated echo signals. After the MR image reconstruction, the $B_1$ map can be derived from the voxel-wise intensity ratio of the two MR images reconstructed from the FID and stimulated echo signals, respectively.

In general, a stimulated echo sequence comprises three (for example 60° or) 90° RF pulses, wherein the first two RF pulses are preparation pulses. The first preparation RF pulse excites magnetic resonance and transforms the longitudinal nuclear magnetization into transverse nuclear magnetization. The second preparation RF pulse "stores" a fraction of the dephased transverse nuclear magnetization along the longitudinal axis. In case of 90° RF pulses this fraction is almost half of the dephased transverse magnetization. The third RF pulse is applied during the acquisition period which is temporally subsequent to the preparation period. The third RF pulse ("reading RF pulse") transforms the stored longitudinal nuclear magnetization into transverse nuclear magnetization again, thereby generating a so-called stimulated echo. Other RF refocused echoes are generated by this three RF pulse sequence, but those are not of interest here and may be suppressed by appropriate gradient switching regimes running in parallel to the RF irradiation. The stimulated echo MR signal together with the FID signal, which is also generated by the third RF pulse, is acquired and used for $B_1$ mapping according to the invention. MR imaging on the basis of stimulated echoes can be accelerated by replacing the third RF pulse by a train of low-flip angle reading RF pulses, wherein each reading RF pulse refocuses only a small portion of the longitudinal nuclear magnetization stored after the preparation period.

It has to be mentioned that the at least two preparation RF pulses used to store $B_1$-encoded magnetization along the z-axis, do not have to be of the same kind or flip angle. However, with respect to the mathematical treatment necessary to evaluate the measuring data, the choice of identical RF pulses and flip angles makes the formalism rather simple. In particular when the flip angle of the preparation RF pulses is equal and the flip angle of the reading RF pulses is different from that of the preparation RF pulses, then the flip angle of the RF preparation cancels in the ratio of the FID and stimulated echo signals.

An important aspect of the invention is that the flip angle of the reading RF pulses causing equal $T_2^*$ weighting of the one or more FID signals ($I_1$) and the stimulated echo signals and one or more stimulated echo signals ($I_2$) during the acquisition period (22). Notably, the reading RF pulses do not fully refocus the FID and stimulated echo signals and have a sequence timing that achieves equal T2* weighting. The acceptable margin of the equal T2*-weighting can be determined from the level of image artefact due to residual signals when the T2*-effects of the FID and stimulated echoes do not fully cancel out. Preferably, the read RF pulses are arranged such that the FID signal is dominated by a so-called 'virgin' FID signal component over refocused FID signal components. This avoids the need for additional refocusing after the read-out of the FID and stimulated echo signals. Thus, the signal acquisition time is short to allow a scan duration for a full B1-map of only a few seconds. This allows to update the B1 map e.g. within a patient's breath-hold. Moreover, as no refocusing is need after the reading of the FID and stimulated echo signals, SAR burden is kept low.

Since the $B_1$ map can be acquired by means of a single repetition of the imaging sequence according to the invention, it is more robust against motion as compared to the other known STEAM-based $B_1$-mapping approaches. The speed of $B_1$ mapping is increased by at least a factor of 2 with respect to known techniques.

A plurality of FID signals and stimulated echo signals with appropriate phase encoding need to be acquired for generating a complete $B_1$ map. Efficient sampling schemes like EPI, parallel imaging or compressed sensing can be advantageously applied for this purpose in combination with the invention.

Moreover, the technique of the invention has an increased dynamic range as compared to the known approaches. This is a result of the conceptually different mapping mechanism of the invention. Furthermore, compared to the Bloch-Siegert STEAM approach the SAR level of the invention is significantly reduced due to leaving out the Bloch-Siegert RF pulse.

In accordance with a preferred embodiment of the invention, the FID and the stimulated echo signals are acquired as gradient-recalled echo signals. The timing of the sequence can be adjusted such that susceptibility- and chemical shift-induced effects are essentially equal for both the FID and stimulated echo signals.

According to another preferred embodiment of the invention, a $B_0$ map indicating the spatial distribution of the main magnetic field within the portion of the body is derived from the acquired FID and stimulated echo signals as well. It turns out that, by using appropriate parameters of the imaging sequence, not only a $B_1$ map, but also a $B_0$ map can be derived from the voxel-wise intensities of the FID and stimulated echo signals. It is an advantage of the invention that a $B_1$ map and a $B_0$ map can be acquired simultaneously without additional measurement steps.

According to another preferred embodiment of the invention, a transceive phase map indicating the spatial distribution of the phase of the transmit/receive RF field within the portion of the body is derived from the acquired FID and stimulated echo signals as well. It turns out that, by using appropriate parameters of the imaging sequence, not only a $B_1$ and a $B_0$ map, but also a transceive phase map can be derived from the voxel-wise intensities of the FID and stimulated echo signals. It is a further advantage of the invention that a $B_1$ map, a $B_0$ map and a transceive phase map can be acquired simultaneously without additional measurement steps.

According to another preferred embodiment of the invention, the parameters of the imaging sequence (e.g. echo times, gradient strength) are selected such that signal contributions from water spins and signal contributions from fat spins are essentially in phase in the FID signals as well as in the stimulated echo signals. This renders the technique robust against chemical shift effects.

According to yet another preferred embodiment of the invention, the parameters of the imaging sequence (e.g. echo times, gradient strength) are selected such that signal contributions from water spins and signal contributions from fat spins superimpose in the FID signals as well as in the stimulated echo signals in such a way as to allow reconstruction of separate water and fat MR images. This allows using the technique for fat-water separation.

According to still another preferred embodiment of the invention, the proposed approach can be used for volumetric $B_1$ mapping and parallel transmit applications.

For volumetric applications a multi-slice version of the proposed technique is advantageous. Therein, an appropriate slice order (e.g. measurement of the odd slices in a 3D stack in a first step and then the even ones in a subsequent measurement step), seems to be useful to avoid potential slice cross-talk. To ease the signal evaluation, as described below, the two preparation RF pulses of the stimulated echo sequence may excite a broader slice, (preferably with a slice thickness increased by a factor of two) than the reading RF pulses. This helps to avoid problems associated with imperfect slice profile excitation in signal evaluation for $B_1$ mapping.

According to a preferred embodiment of the invention, the RF pulses are radiated towards the portion of the body via two or more RF coils or sets of RF coils, wherein a $B_1$ map is derived from the acquired FID and stimulated echo signals for each RF coil or set of RF coils, each $B_1$ map indicating the spatial distribution of the RF field of the RF pulses irradiated via the respective RF coil or set of RF coils. In this embodiment of the invention, $B_1$ mapping is performed for multiple RF transmit elements (RF coils) of the used MR device to map their corresponding transmit sensitivities. An individual mapping scan has to be performed according to the method of the invention for each individual RF transmit element (or for a combination of them). To avoid signal saturation problems, a suitable delay has to be used in single slice applications. The temporal order of the individual mapping scans can be optimized advantageously according to the corresponding transmit regions covered by the respective RF transmit elements, thereby minimizing the total scanning time. In case of volumetric $B_1$ mapping, multi-slice/multi-channel mapping may be beneficial for selected applications. Therein, the transmit sensitivities of the individual channels are mapped in individual adjacent slices which are close enough to each other to be considered to be representative for the corresponding location. In this way, $B_1$ mapping for multiple transmit channels can be made even more efficient.

The $B_1$ maps obtained according to the invention can advantageously be used in subsequent imaging scans for RF shimming. RF shimming refers to the spatial homogenization of the RF transmit field by adjustment of the complex amplitudes of the RF pulses radiated via the individual RF coils of a parallel transmit MR imaging system. Simple known RF shimming approaches use predefined, anatomy-specific RF shim sets, without taking the individual patient anatomy into account. The invention enables a more advanced RF shimming approach, which optimizes the RF shim settings in a patient specific way. For this purpose, $B_1$ maps are derived for the individual transmit RF coils from the FID and stimulated echo signals in the above-described fashion and optimal RF shim sets are derived from the $B_1$ maps by (per se known) numerical methods.

In case of MR imaging of the thorax and the abdomen, dynamic changes of the RF field may be expected due to motion (for example breathing motion of the patient), because motion-induced displacements of anatomical structures potentially affect the spatial conductivity and permittivity. Hence, the RF shim settings, derived for example from a single calibration scan, may degrade, if the subsequent diagnostic MR imaging scan is performed in a different position or motional state of the patient. This can potentially influence MR image contrast and specific absorption (SAR) of the employed imaging pulse sequence.

Against this background, the method of the invention may further comprise the steps of:

subjecting the portion of the body to a navigator sequence comprising one or more RF pulses and switched magnetic field gradients, which navigator sequence is applied at least once before, during or after the stimulated echo sequence, whereby navigator signals are acquired from the portion of the body, deriving motion data from the navigator signals, which motion data reflect motion of the body; and assigning a motional state derived from the motion data to the $B_1$ map.

A navigator sequence within the meaning of the invention is generally a scanning sequence which can be used for determining and acquiring motion data. By means of the navigator sequence, which is per se known in the art, typically low-resolution data of a one-, two- or three-dimensional volume is acquired for measuring a translation of an anatomical feature along at least one coordinate axis and/or a rotation of the anatomical feature about at least one coordinate axis. This motion data can be used according to the invention to assign a $B_1$ map (of each transmit RF coil) to a motion state of the patient. Preferably, a plurality of $B_1$ maps are derived from the FID and stimulated echo signals acquired during repetitions of the stimulated echo sequence and the navigator sequence, wherein each $B_1$ map is assigned to a different motional state of the patient. According to this embodiment, the invention proposes to exploit the real-time RF shimming capability of advanced parallel transmit MR imaging systems to adapt the RF shim settings dynamically according to the motional state (for example the respiratory phase). For this purpose, motional state resolved $B_1$ maps may be acquired in a $B_1$ calibration scan according to the technique of the invention, wherein navigator sequences are used to identify the motional state.

According to a further preferred embodiment of the invention, the at least two preparation RF pulses each have a flip angle of 45°-90°. In this way the amplitudes of the acquired stimulated echo signals are maximized which is advantageous in terms of signal-to-noise.

According to another preferred embodiment of the invention, a plurality of FID and stimulated echo MR signals are generated by means of a plurality of consecutive reading RF pulses, each having a flip angle of less than 90°, preferably less than 45°, most preferably less than 30°. As already mentioned above, a train of reading RF pulses having small flip angles can be used to achieve a fast readout of multiple FID and stimulated echo signals. As short as possible echo times can be used in order to minimize $T_2^*$ relaxation.

According to yet another preferred embodiment of the invention, switched magnetic field gradients are applied during the preparation period after the two preparation RF pulses, in order to spoil residual nuclear magnetization.

An accurate estimate of the specific absorption rate (SAR) of RF power deposition during MR imaging is vital to patient safety, especially if local transmit arrays of RF coils are used. With such local transmit coil arrays, the dynamic change of the relative position of the RF coil and the body tissue of the patient generally needs to be monitored during an MR imaging scan to guarantee safe operation of the RF transmit coils. SAR simulations for individual body models are typically performed and stored in tables or in a data base to assess patient safety. However, it has to be taken into account that local SAR hotspots are generally patient-dependent and depend on motion due to breathing and other types of body motion.

Hence, according to a preferred embodiment of the invention, the local specific RF absorption rate (SAR) within the portion of the body is estimated from the $B_1$ map derived in the above-described fashion. The determined SAR may then advantageously be used to control the amplitude and phase of RF pulses radiated toward the portion of the body, for example during a subsequent diagnostic MR imaging scan. This control can be performed in such a manner that SAR safety limits are complied with.

Whereas whole and partial body SAR can be estimated from the accepted power of a body transmit RF coil and the exposed body mass, the influence of body motion due to breathing and inner motion of organs is negligible. For local transmit RF coil arrays, in contrast, the influence on local SAR due to motion is increased and can be monitored and controlled in accordance with the invention. SAR management is actually a central issue in the context of local parallel RF transmission with regard to patient safety. The additional degrees of freedom available in local parallel RF transmission hamper straight-forward global and/or local SAR estimations due to breathing and body motion of the patient. The invention proposes to dynamically monitor the $B_1$ distribution generated by the transmit RF coil array, wherein RF transmitters used for driving the transmit RF coils can be feedback compensated during or before the MR imaging scan.

The proposed method is particularly advantageous for the parallel use of a local transmit RF coil array in combination with a receive RF coil array, which is distinct from the transmit RF coil array. $B_1$ shading caused by the receive RF coils can be automatically monitored and compensated for by the method of the invention.

According to a further preferred embodiment of the invention, two stimulated echo signals, preferably a direct stimulated echo signal and a conjugate stimulated echo signal are acquired during the acquisition period. Preferably, the direct stimulated echo signal and the conjugate stimulated echo signal are acquired as gradient-recalled echo signals. This embodiment of the invention enables to derive the $B_0$ map at a short effective spectral sampling interval, thereby reducing undesirable phase wrapping. The method of the invention is a potential candidate for a global preparation scan in MR imaging, since it can be used to obtain $B_1/B_0$ maps and also receive coil sensitivity information (which is useful for parallel imaging techniques like SENSE). It turns out that the acquisition of the direct stimulated echo signal and the conjugate stimulated echo signal are beneficial to obtain additional information on the fat-water composition in the examined body portion. Moreover, the acquisition of the direct stimulated echo signal and the conjugate stimulated echo signal support a $T_2$-compensated acquisition scheme.

The stimulated echo-based $B_1$ mapping technique of the invention allows a $B_1$ map to be acquired in a single shot of the stimulated echo sequence in about 100 ms duration, making this approach in principle real-time capable, as mentioned above. However, it has to be taken into account that MR pulse sequences with short repetition time (i.e. $T_R \ll T_2, T_1$) establish typically a steady-state, where many coherence pathways contribute to the measured transverse magnetization. The $B_1$ mapping principle according to the invention is based on the assumption that the preparation period of the stimulated echo sequence starts from thermal equilibrium. Hence, the repetition time of the sequence in a dynamic $B_1$ mapping scan or a parallel transmit $B_1$ calibration scan must be in the order of several $T_1$ to avoid a potential degradation of the accuracy of the method. Assuming a typical longitudinal nuclear spin relaxation time $T_1$ of one second and a duration of a $B_1$ mapping scan according to the invention of about 200 ms, it becomes obvious that only a small fraction of the total acquisition time can be actually used for scanning of the same local region of the portion of the patient's body.

To overcome this limitation, the stimulated echo sequence of the invention may be repeated several times, with the repetition time being shorter than the longitudinal nuclear relaxation time $T_1$, wherein the two preparation RF pulses have a phase difference which is varied after each repetition of the stimulated echo sequence. In this way, a steady state of the nuclear magnetization is generated. Simultaneously, efficient MR signal spoiling is achieved by the variation of the phase difference of the two preparation RF pulses with each repetition of the stimulated echo sequence. This results in a cancellation of undesirable coherences from previous excitations. Hence, only magnetization recovered by $T_1$ relaxation during the last repetition period contributes to the FID and the stimulated echo signals and the individual MR signals generated by successive repetitions of the sequence become rather independent from each other. Consequently, the $B_1$ mapping technique of the invention can be applied with a repetition time, which is shorter than the longitudinal relaxation time $T_1$. For example, the repetition time may be shorter than $0.5\, T_1$, or even as short as $0.1\, T_1$.

In a further preferred embodiment of the invention, the phase difference of the two preparation RF pulses is incremented by a given phase increment after each repetition of the stimulated echo sequence. It turns out that an optimum suppression of undesirable coherences of the MR signal can be achieved by linearly incrementing the phase difference of the two preparation RF pulses with each repetition of the stimulated echo sequence. In this case, the phase difference of the two preparation RF pulses in the n-th repetition step equals $n \times \Delta\Phi$, wherein $\Delta\Phi$ is the phase increment. An optimum value of the phase increment is between 80° and 100°, preferably 90°. A phase increment of 90° provides an optimum accuracy of the $B_1$ mapping technique of the invention.

In a further preferred embodiment of the invention, the FID signal is acquired two or more times as gradient-recalled echo signals at different echo times. Alternatively or in addition, also the stimulated echo signal may be acquired two or more times as gradient-recalled echo signals at different echo times. This can easily be achieved by prolonging the corresponding readout gradients and switching their polarity. In this preferred embodiment of the invention, the $B_1$ mapping remains essentially unaffected. Only the echo times and thus the influence of $T_2$ are slightly increased. Water-fat separation and $B_0$ mapping can be performed on the basis of the magnitudes and phases of the two or more measured FID and stimulated echo signals using the per se known Dixon or mDixon techniques (see Eggers et al., MRM 2011, 65, 96-107). The echo spacing between the measured FIDs and/or stimulated echo signals can basically be chosen freely.

The method of the invention described thus far can be carried out by means of a MR device including at least one main magnet coil for generating a uniform steady magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention is preferably implemented by a corresponding programming of the reconstruction unit and/or the control unit of the MR device.

The methods of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

The enclosed drawings disclose preferred embodiments of the present invention. It should be understood, however, that the drawings are designed for the purpose of illustration only and not as a definition of the limits of the invention. In the drawings:

FIG. 1 schematically shows a MR device for carrying out the methods of the invention;

Figure 1:
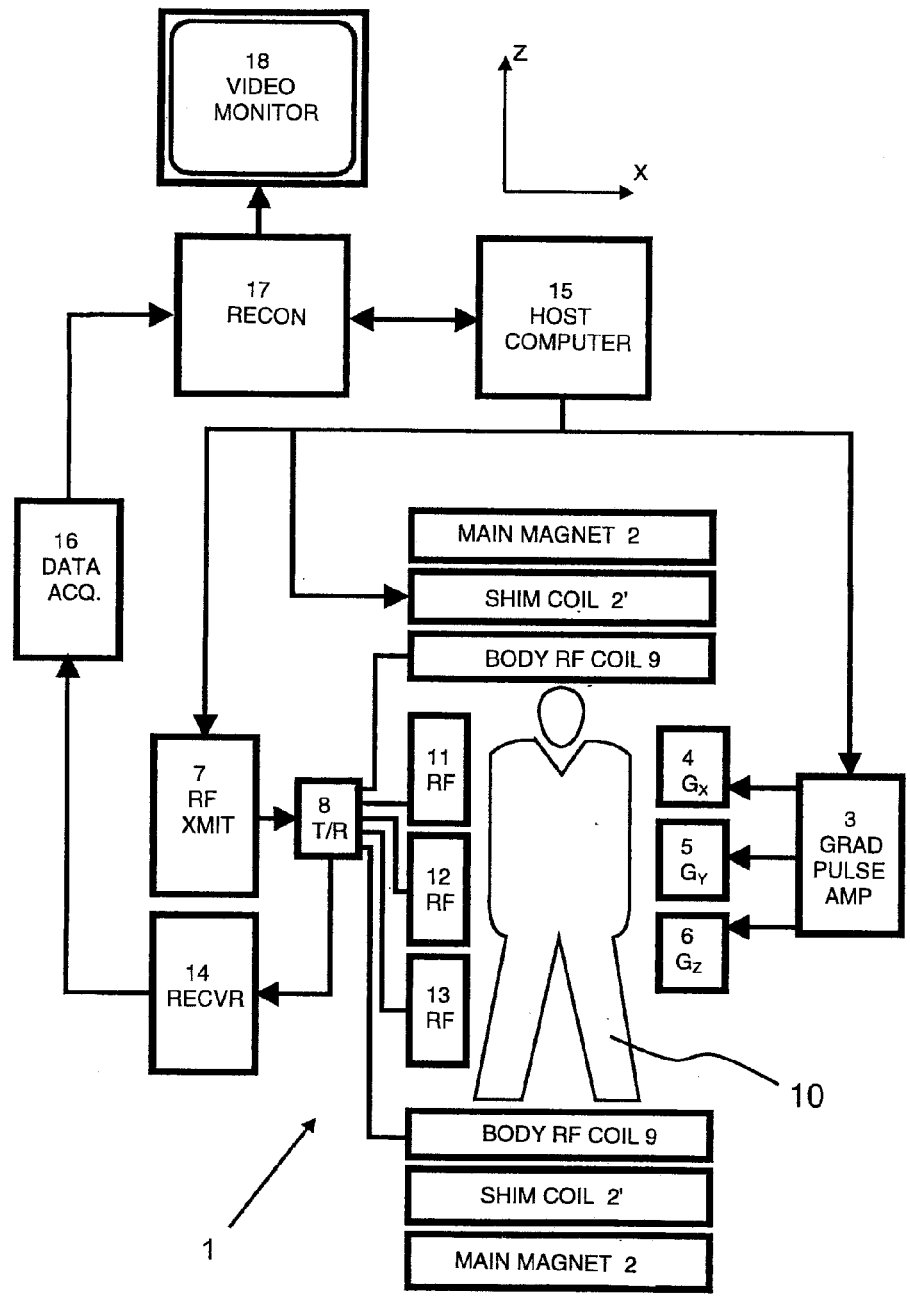

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions. In parallel transmit applications, the array RF coils 11, 12, 13 may also be used for RF transmission, for example for the purpose of RF shimming.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
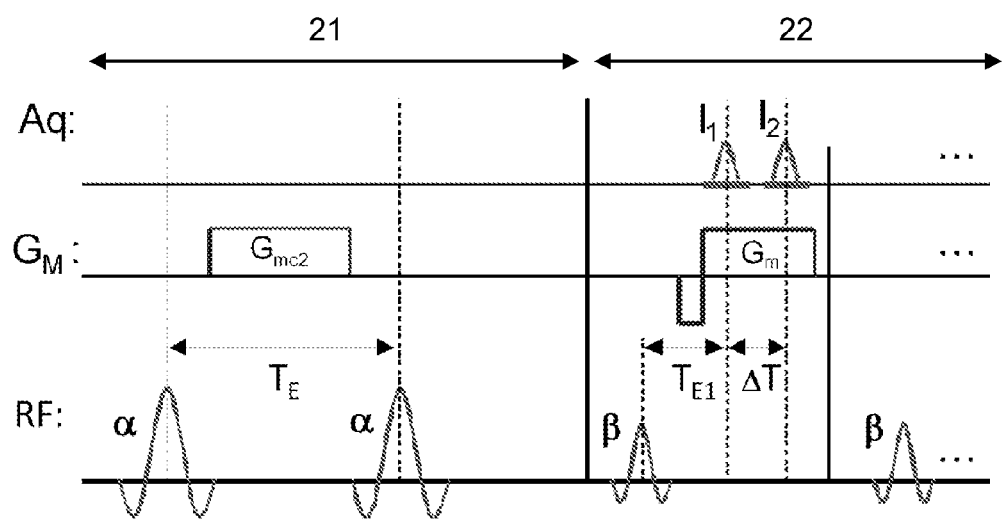
FIG. 2 shows a schematic diagram illustrating an imaging sequence according to the invention.

FIG. 2 shows a diagram illustrating an imaging sequence according to the invention. The depicted imaging sequence is a stimulated echo sequence which is subdivided into a preparation period 21 and an acquisition period 22. Two preparation RF pulses having a flip angle of $\alpha$ are applied during the preparation period 21. The two preparation RF pulses are separated by a time interval $T_E$. A de-phaser magnetic field gradient $G_{mc2}$ is applied between the two preparation RF pulses. A sequence of reading RF pulses having flip-angle $\beta$ are generated during the acquisition period 22, which is temporally subsequent to the preparation period 21. An FID signal $I_1$ and a stimulated echo signal $I_2$ are acquired after each reading pulse as gradient-recalled echoes.

Directly after the preparation sequence 21, the longitudinal magnetization is given by:

$$M_{z1} = \cos^2(\alpha) \cdot M_0$$

$$M_{z2} = \tfrac{1}{2} \sin^2(\alpha) M_0,$$

wherein $M_{z1}$ and $M_{z2}$ denote the un-prepared (i.e. in-phase) and the stimulated echo-prepared (i.e. de-phased) longitudinal magnetization, respectively. In accordance with the invention, both the FID signal $I_1$ generated from $M_{z1}$ and the stimulated echo signal $I_2$ generated from $M_{z2}$ are acquired at different points in time $T_{E1}$ and $T_{E1}+\Delta T$, respectively. The delay $\Delta T$ between the two echoes $I_1$, $I_2$ is determined by the relation:

$$\Delta T = A_{mc2}/G_m,$$

wherein Amc2 denotes the gradient-time area of the de-phaser gradient Gmc2 and Gm denotes the strength of the readout magnetic field gradient. Neglecting T1- and T2-effects, the two acquired echo signals I1 and I2 are given by:

$$I_1 = S \cdot C(T_{E1}) \sin(\beta) M_{z1}$$

$$I_2 = S \cdot C(T_{E1}+\Delta T - T_E) \sin(\beta) M_{z2},$$

wherein S represents a complex system constant, which is equal for both echo signals $I_1$ and $I_2$ and which is determined e.g. by transmit and receive coil sensitivities for a given voxel. $\beta$ is the nominal flip angle of the reading RF pulses. C describes the static signal de-phasing for a given voxel due to susceptibility and chemical shift effects:

$$C(t) = \int_V \rho(r) e^{-i\omega(r)t} \, dr,$$

wherein $\rho$ and $\omega$ denote the proton density and the off-resonance frequency offset, respectively. The integral describes the summation over the given voxel. By applying the timing scheme $$T_E = 2T_{E1} + \Delta T$$

the measured echo signals $I_1$ and $I_2$ are given by:

$$I_1 = S \cdot C(T_{E1}) \sin(\beta) M_{z1}$$

$$I_2 = S \cdot C^*(T_{E1}) \sin(\beta) M_{z2}$$

Thus, the de-phasing term C is identical for both echo signals, apart from the mirrored phase. For example by selecting $T_{E1}=2.3$ ms at a main magnetic field strength of 3 Tesla, signal contributions from water spins and signal contributions from fat spins are essentially in phase for both echoes $I_1$, $I_2$. Combining the above equations yields:

$$|I_2/I_1| = \tan^2(\alpha)/2$$

Thus, the unknown flip angle $\alpha$ of the stimulated echo preparation RF pulses can be derived from the ratio of the acquired echo signals according to:

$$\alpha = \arctan \sqrt{2|I_2/I_1|}$$

The mirrored phase of the stimulated echo signal $I_2$ may be further employed to derive a $B_0$ phase map:

$$\varphi_{B_0} = \arg(C(2T_E)) = \arg(I_1 \cdot I_2^*)$$

Moreover, a map of the phase shift induced by the transmit/receive chain of the used MR device 1 can be determined from the measured echoes $I_1$, $I_2$ according to:

$$2\varphi = \arg(S^2) = \arg(I_1 \cdot I_2)$$

It has to be noted that for $B_1$ mapping also the alternative timing scheme $T_E = \Delta T$ can be employed, which results in identical de-phasing terms, i.e. without mirrored phase. However, this variant results in a longer $\Delta T$ and, hence, a longer overall repetition time of the sequence. Moreover, the separation of the different phase contributions for the purpose of e.g. $B_0$ mapping is no longer possible.

Finally, also the alternative timing scheme $T_E = T_{E1} + \Delta T$ can be employed, which fully preserves the spin echo properties of the stimulated echo. This timing scheme would still allow for fat-water in-phase echo times for both signals. In addition, the stimulated echo signal would directly yield the transceive phase and a $B_0$ phase map could be generated according to the formulae indicated above.

Figure 3:
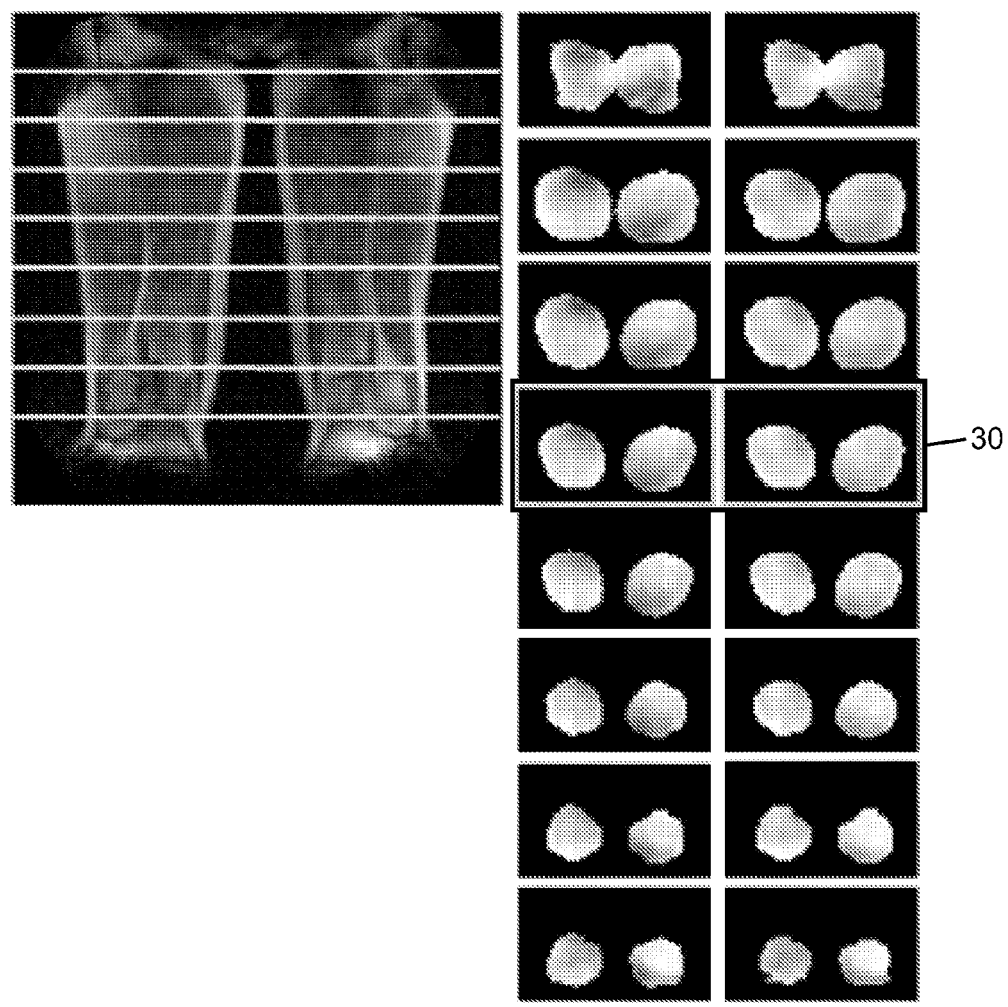
FIG. 3 shows $B_1$ maps acquired and computed according to the invention.

FIG. 3 shows $B_1$ maps of the legs acquired by means of the method of the invention. The $B_1$ maps cover the complete thighs. The $B_1$ mapping experiments were performed in vivo on a 3 Tesla MR imaging system equipped with 8 transmit channels and an 8-element transmit/receive body coil 9. The imaging sequence as shown in FIG. 2 was used for $B_1$ mapping and corresponding RF shimming. 8 image slices were acquired with a field-of-view of 450×270×15 mm³. A scan matrix of 64×38×1 was used with a slice gap of 30 mm. The nominal flip angle of the stimulated echo preparation RF pulses amounted to $\alpha=60°$, the nominal flip angle of the reading RF pulses amounted to $\beta=20°$. A repetition time of 3.7 ms was selected. 38 profiles were acquired per repetition of the sequence. The total duration of the scan amounted to 1.2 s. The chosen echo timing scheme ($T_E=5.6$ ms, $T_{E1}=2.3$ ms, $\Delta T=1$ ms) resulted in in-phase water and fat signals for both echoes $I_1$, $I_2$. The left image in FIG. 3 shows a survey scan indicating the slice positions of the $B_1$ mapping scans. The left and right columns in the right part of FIG. 3 show the $B_1$ maps acquired according to the invention. In the $B_1$ maps of the left column quadrature shim settings were applied. These maps show the typical shading artefacts indicating $B_1$-inhomogeneity. Optimized RF shim settings were derived from the $B_1$ maps of slice 30. The right column shows the $B_1$ maps acquired according to the invention with the optimized RF shim settings. The shading artefacts are significantly reduced for RF shimmed excitation. The variation of the $B_1$ field is reduced by at least 50%.

Figure 4:
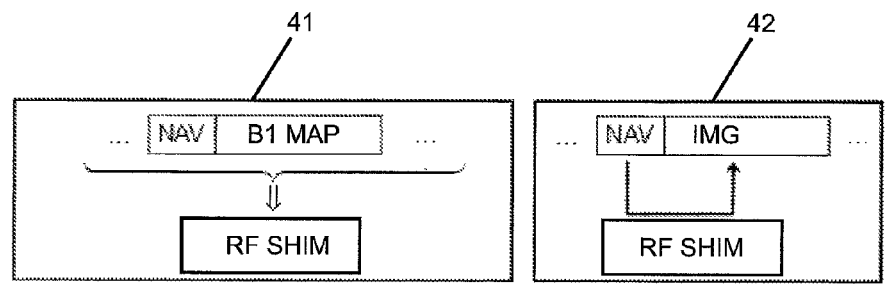
FIG. 4 illustrates the application of the method of the invention in combination with navigators.

FIG. 4 shows a schematic diagram illustrating the application of the method of the invention in combination with navigators for dynamic $B_1$ mapping and real-time RF shimming in a parallel transmit application. RF shim settings are determined from a calibration scan 41 and used for real-time RF shimming in a subsequent diagnostic imaging scan 42. In the calibration scan 41, in which the patient is allowed to breathe freely, navigators NAV and $B_1$ mapping scans B1 MAP according to the invention are applied for the individual transmit RF coils of the used MR device. $B_1$ maps are acquired in a dynamic loop for several respiratory cycles. A respiratory phase-resolved set of RF shim settings RF SHIM is derived by an appropriate optimization algorithm (as for example described by Setsompop et al., MRM 2008, 59, 908-15). The resulting RF shim settings are assigned to the different motional states derived from the navigator signals by an appropriate model. This can be a lookup table, storing the calculated RF shim settings along with the corresponding motional states. More advanced models are conceivable that are calibrated on the basis of the $B_1$ mapping scan. In the subsequent diagnostic scan 42, a navigator sequence NAV is used to steer the RF shim settings. Based on the motional state derived from the navigator signals during the diagnostic scan 42, an appropriate RF shim setting is selected from the set RF SHIM and is used for the following image data acquisition sequence IMG.

Figure 5:
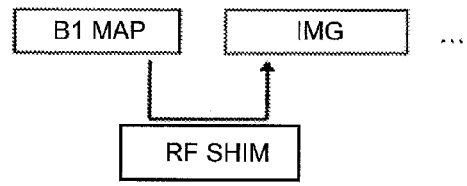
FIG. 5 illustrates an alternative application of the method of the invention in combination with RF shimming.

A further application scenario of the technique of the invention is illustrated in FIG. 5. This embodiment may relate, for example, to a dual channel parallel transmit system, in which two RF coils are used for generating the RF fields. For an abdominal application, for example, a RF shimmed axial scan is executed. Like respiratory motion also peristaltic motion and motion of the bowel gases influence the RF shimming performance. Therefore, the $B_1$ maps are measured almost instantaneously by means of the technique of the invention in step B1 MAP for the two transmit channels before the actual abdominal scan IMG. To this end, an axial multi-slice stimulated echo scan according to the invention can be used for acquiring FID and stimulated echo signals from two or three adjacent slices arranged very close and parallel to each other. The active transmit channel is alternated for neighboring slices. Thus, the $B_1$ maps of the two transmit channels are determined in almost identical anatomical environments, i.e. without the need to employ a long relaxation interval. Dual channel $B_1$ mapping can be performed in this way in 300-450 ms, followed by the real-time calculation of appropriate shimming coefficients RF SHIM, which can be applied in the subsequent imaging scan IMG, as illustrated in FIG. 5. In case of a segmented image acquisition it might be necessary to repeat the real-time mapping procedure B1 MAP in front of every scan segment.

Figure 6:
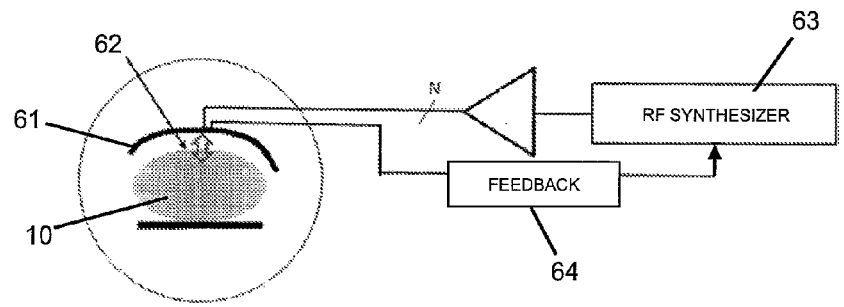
FIG. 6 illustrates the application of the method of the invention for SAR monitoring.

FIG. 6 schematically illustrates the application of the method of the invention for SAR monitoring. FIG. 6 shows the body 10 of the patient in a cross-sectional view through the examination volume of a MR device. A local transmit RF coil array 61 of a flexible design is located on the surface of the body 10. Any relative change of electrical parameters due to motion or breathing (indicated by arrow 62) is monitored in real-time by a feedback system 64, which is used to control an RF synthesizer 63 with respect to the amplitude and phase of the transmit RF pulses radiated via each of the individual RF coils of the transmit RF coil array 61. The control is performed in such a manner that SAR safety thresholds are complied with. The transmitted RF pulses are compensated to prevent local SAR hot spots. Input parameters for the feedback system 64 are obtained by estimating SAR within the portion of the body 10 from the $B_1$ maps that are derived from stimulated echo measurements according to the above-described method of the invention. Generally, the interaction between the RF coils and the body 10 can be monitored using different sensors, which may be integrated into the transmit RF coil array 61. Sensors may be used, which measure directly the distance and/or position of the individual RF coils relative to the body 10. Further sensors may be used that measure the input impedance of the RF coils. Moreover, sensors may be used which provide information about the status of the mechanical form (bending) of the transmit RF coil array 61. All these sensors may be used to acquire input parameters of the feedback system 64.

Figure 7:
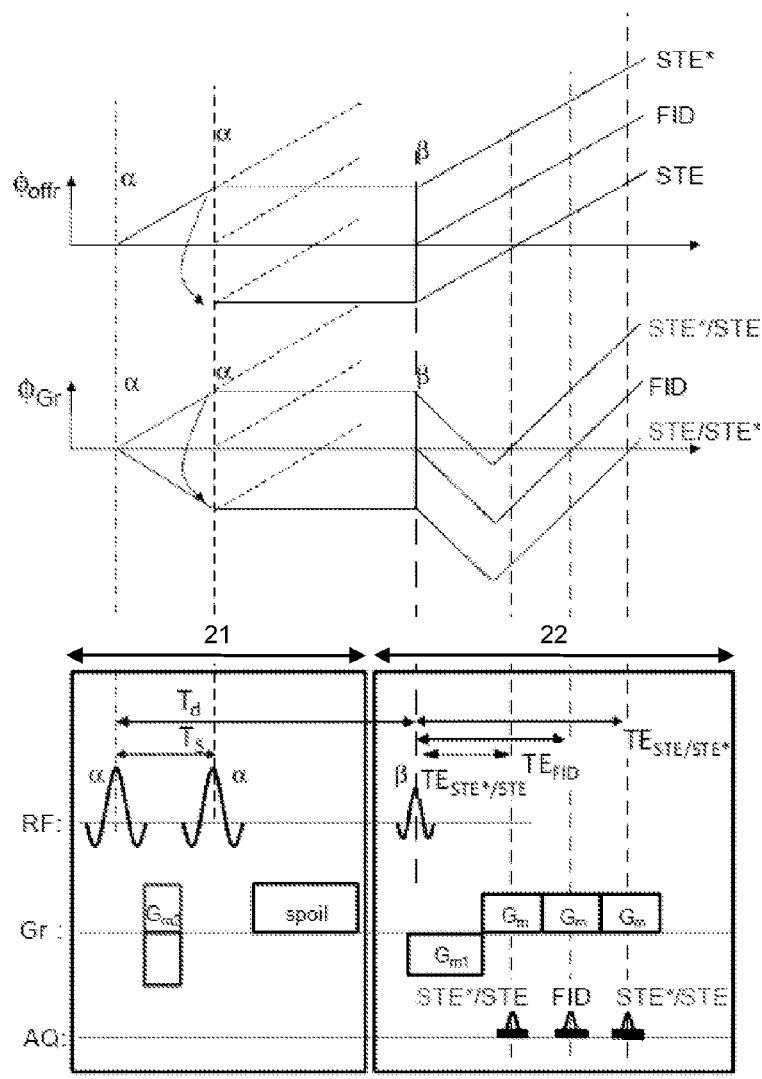
FIG. 7 shows a schematic diagram illustrating an imaging sequence according to another embodiment of the invention, in which direct and conjugate stimulated echo signals are acquired.

FIG. 7 shows a diagram illustrating an imaging sequence according to another embodiment of the invention. The diagram shows the imaging sequence (bottom) along with phase graphs showing the coherence pathways for static, susceptibility-related gradients (top) and switched gradients (centre). The reading RF pulse sequence consists of a preparation period 21 and an acquisition period 22. The reading RF pulse β creates an FID signal, a stimulated echo STE and a conjugate stimulated echo STE*, which are acquired as separate gradient-recalled echoes $I_{FID}$, $I_{STE}$ and $I_{STE*}$. The acquisition order is determined by de-phaser gradient $G_{m2}$. The timing of the three gradient echoes is controlled by the switched gradients $G_{m1}$, $G_m$ (illustrated by the lower phase graph $\Phi_{Gr}$). The upper phase graph $\Phi_{off}$ illustrates the impact of static inhomogeneities, and, hence, the spectral encoding of the signals.

Directly after the stimulated echo preparation period 21, the longitudinal nuclear magnetization is given by:

$$M_{z,FID} = \cos^2(\alpha) \cdot M_0$$

$$M_{z,STE} = \frac{1}{2} \sin^2(\alpha) \cdot M_0$$

$$M_{z,STE*} = \frac{1}{2} \sin^2(\alpha) \cdot M_0,$$

where $M_{z,FID}$ denotes the unprepared (i.e. in-phase) longitudinal magnetization, and $M_{z,STE}$ and $M_{z,STE*}$ denote the two mirrored stimulated echo prepared (i.e. de-phased) longitudinal magnetization contributions. The transverse magnetization components (i.e. the FID from the first RF pulse α, the FID and the spin echo from second RF pulse α) are spoiled by a strong crusher gradient and will not be further considered. Hence, the reading RF pulse β of the imaging sequence generates three transverse signal contributions:

$$I_{FID} = S \cdot C(t) \sin(\beta) M_{z,FID}$$

$$I_{STE} = S \cdot C(t-T_S) \sin(\beta) M_{z,STE}$$

$$I_{STE*} = S \cdot C(t+T_S) \sin(\beta) M_{z,STE*},$$

wherein S represents a complex system constant, which comprises e.g. transmit and receive coil sensitivities for a given voxel, and β is the nominal flip angle of the reading RF pulse. Furthermore, C describes the static signal de-phasing for a given voxel due to susceptibility and chemical shift effects, $$C(t) = \int_V \rho(r) e^{-i\omega(r) \cdot t} dr,$$

wherein r and ω denote proton density and off-resonance frequency offset, and the integral describes the summation over the given voxel. While the STE signal $I_{STE}$ refocuses as a stimulated echo, the STE* signal $I_{STE*}$ further de-phases, and, hence, is therefore typically discarded in a conventional stimulated echo experiment. However, the imaging sequence shown in FIG. 7 employs tailored switched magnetic field gradients to acquire all three signal contributions as separate re-called gradient echoes at deliberately chosen echo times. The relations for the gradient areas of the measurement gradient $G_m$, the re-phaser gradient $G_{m1}$ and the stimulated echo de-phaser gradient $G_{m2}$ are:

$$A(G_{m1}) = -1.5 A(G_m)$$

$$A(G_{m2}) = \mp A(G_m),$$

The first equation ensures that the gradient echo of the FID is refocused at the centre of the second readout gradient $G_m$. The second equation ensures that the direct stimulated echo STE and the conjugate stimulated echo STE* are refocused at the centre of the first and third readout gradient $G_m$, respectively. The acquisition order (STE-FID-STE* or STE*-FID-STE) is determined by the polarity of the stimulated echo de-phaser gradient $G_{m2}$. Within the general sequence timing constraints resulting from e.g. acquisition bandwidth or RF and gradient power limitations, the gradient echoes times (i.e. time of the gradient echo top) may be independently selected to obtain a desired spectral encoding for the different echoes. For example, a $T_{-}/T_2$-compensated acquisition scheme may be obtained by using a STE*-FID-STE acquisition order additionally obeying the timing scheme $TE_{STE*} = TE_{FID} - T_S$. Then, both the spectral encoding time (i.e. the $T_{2*}$ evolution time) and the $T_2$ evolution time are identical for both the STE* and the FID signal, namely $TE_{FID}$. Therefore, the effect of $T_2$ and $T_{2*}$ cancels in the $B_1$ map derived from the ratio of the STE* and FID signals. This allows to increase the accuracy of the $B_1$ mapping process in species that exhibit short $T_2$ or in areas of strong susceptibility gradients. For the sake of a minimal repetition time, the acquisition of the STE signal at the end of the sequence could be simply omitted. This would result in a dual echo approach similar to the above-described embodiment shown in FIG. 2 but acquiring the FID signal and the conjugate stimulated echo STE* instead. Alternatively, the STE signal could be acquired additionally at the echo time $TE_{STE} = TE_{FID} + T_S$, resulting in an equidistant sampling scheme for the three gradient echoes. Thus, the STE and STE* signals have the same spectral encoding time, namely $TE_{FID}$ and differ only in the $T_2$ evolution time, which is $TE_{FID} + 2T_S$ for the STE. Hence, MR images reconstructed from the STE and STE* signals could be added before further signal evaluation to improve the signal-to-noise ratio of the resulting $B_1$ map in case of sufficiently long $T_2$. Alternatively, in the case of strong $T_2$ relaxation, the $T_2$ value could be roughly estimated from the ratio of the signals according to $$T_2 \approx 2T_S / \ln(I_{STE*}/I_{STE}),$$

assuming a single-exponential $T_2$ decay. Moreover, a different flow encoding of the STE* and STE signals may be utilized. As a further alternative, different spectral encoding times for the STE and STE* signals may be chosen. In this way, $T_{2*}$ or more importantly chemical shift effects can be encoded into the two different STE and STE* echo signals. Thus, a two point Dixon approach with flexible echo times (see Eggers et al., "Dual-echo Dixon imaging with flexible choice of echo times", MRM 2011, 65, 96-107, and Berglund et al., "Two-point Dixon method with flexible echo times", MRM 2011, 65, 994-1004) may be applied on the MR images reconstructed from the STE* and STE signals to separate water and fat signals and to generate an estimate of a $B_0$ map. Similar to conventional two-point Dixon, roughly in-phase/opposed-phase encoding times would be preferably chosen to optimize the stability of the approach. However, in contrast to conventional Dixon sequences, no change of the gradient polarity is required, which results in a shorter sequence and reduces odd/even eddy current related phase errors. To refine the estimate of the $B_0$ map, which is not an easy task if it is based on two echoes only, the information of the FID signal (amplitude, phase) could be added. In addition, as a further refinement, the method could be combined with the conventional Dixon technique by switching the gradient polarity after the STE*-FID-STE acquisition to obtain a second STE-FID-STE* acquisition at different spectral encoding times. The additional information provided by the extended sequence could be used to improve the robustness and accuracy of the method.

Figure 8:
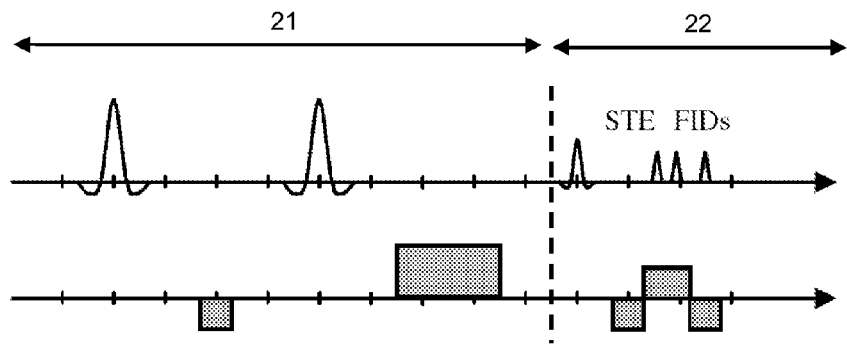
FIG. 8 shows a schematic diagram illustrating a further embodiment of the imaging sequence according to the invention, in which the FID signal is measured twice at different echo times.

In the diagram of FIG. 8, the free induction decay signal FID is measured twice at different echo times. This is achieved in the depicted embodiment by prolonging the readout magnetic field gradient and switching its polarity in between. In this way, $B_1$ mapping according to the invention remains essentially unaffected. Only the echo time and, thus, the influence of $T_2$ are slightly increased. Water-fat separation and the $B_0$ mapping can be performed on the basis of the two measured signal magnitudes and phases of the FID using the Dixon technique. It is possible to integrate the information on $B_0$ available from the stimulated echo technique of the invention into the Dixon technique to stabilize the water-fat separation and the $B_0$ estimation. In particular, it is possible to choose the echo spacing between the two measured signals of the FID very short and to mainly rely on these measured signals to resolve potential phase wrapping, whereas the spacing between the measured stimulated echo signal STE and the two measured signals of the FID may be kept longer to preserve accuracy, i.e. to reduce the influence of noise. Moreover, a joint $B_0$ and $B_1$ mapping and water-fat separation can be performed according to the invention. This allows choosing non-in-phase and even non-symmetric echo times for the free induction decay signal FID and the stimulated echo signal STE. The acquired signals may be modeled as:

$$S_1 = (W + c_1 F) e^{i\varphi + (i\Delta\varphi - R_2^*) TE_1}$$

$$S_2 = b(W + c_2 F) e^{i\varphi + (i\Delta\varphi - R_2^*) TE_2}$$

$$S_3 = b(W + c_3 F) e^{i\varphi + (i\Delta\varphi - R_2^*) TE_3}$$

W and F denote the water and fat contributions, c the magnitude and phase modulation of a pure fat signal over the respective echo times, $\varphi$ the initial phase, $\Delta\varphi$ the phase offset due to $B_0$, $R_{2*}$ the effective transverse relaxation rate ($1/T_2^*$), TE the respective echo time, and b a weighting reflecting the influence of $B_1$. W and F, as well as $\Delta\varphi$, or $B_0$, and b, or $B_1$, can be determined on the basis of this model.

Similarly, it is conceivable to measure the stimulated echo signal STE, instead of the FID signal, twice or to measure both the stimulated echo signal STE and the FID signal twice, for instance by extending the readout gradients further such that the stimulated echo signal STE is re-phased again, or to measure the FID signal three times at different echo times, in order to also resolve eddy current-induced phase errors resulting from the use of a bipolar readout gradient.

The invention claimed is:
1. A method of MR imaging of at least a portion of a body placed in an examination volume of an MR device, the method comprising:

subjecting the portion of the body to a stimulated echo imaging sequence of RF pulses and switched magnetic field gradients, which stimulated echo sequence includes:
  i) radiating at least two preparation RF pulses (α) toward the portion of the body via at least one RF coil during a preparation period,
  ii) radiating one or more reading RF pulses (β) toward the portion of the body via the at least one RF coil during an acquisition period temporally subsequent to the preparation period,
  iii) with at least one gradient magnetic field coil, subjecting the portion of the body to the switched magnetic field gradient during the preparation and acquisition periods, and
  iv) acquiring one or more FID signals ($I_1$) and one or more simulated echo signals ($I_2$) via the at least one RF coil during the acquisition period;
wherein a timing among the preparation and reading RF pulses and the switched magnetic field gradients is selected such that the one or more FID signals ($I_1$) and one or more stimulated echo signals ($I_2$) acquired during the acquisition periods have an equal T* weighting;
deriving a $B_1$ map indicating a spatial distribution of an RF field of the RF pulses within the portion of the body from the acquired FID ($I_1$) and stimulated echo ($I_2$) signals;
reconstructing separate water images and fat images from signal contributions from water spins and signal contributions from fat spins superimposed in the FID signals ($I_1$) and the stimulated echo signals ($I_2$);
controlling a display device to display the water and fat images.

2. The method of claim 1, wherein the signal contributions from water spins and signal contributions from fat spins are essentially in phase in the FID signals ($I_1$) and in the stimulated echo signals ($I_2$).

3. A method of MR imaging of at least a portion of a body placed in an examination volume of an MR device, the method comprising:
  subjecting the portion of the body to a stimulated echo imaging sequence of RF pulses and switched magnetic field gradients, which stimulated echo sequence includes:
    i) radiating at least two preparation RF pulses (α) towards the portion of the body via two or more RF coils, during a preparation period, and
    ii) one or more reading RF pulses (β) radiated toward the portion of the body during an acquisition period temporally subsequent to the preparation period;
  acquiring one or more FID signals ($I_1$) and one or more stimulated echo signals ($I_2$) during the acquisition period;
  wherein a timing among the preparation and reading RF pulses is selected such that one or more FID signals ($I_1$) and one or more stimulated echo signals ($I_2$) acquired during the acquisition period have an equal $T_2^*$ weighting;
  deriving a $B_1$ map from the acquired FID ($I_1$) and stimulated echo ($I_2$) signals for each RF coil or set of RF coils, each $B_1$ map indicating a spatial distribution of the RF field of the RF pulses irradiated via the respective RF coil or set of RF coils.

4. The method of claim 3, wherein the FID ($I_1$) and stimulated echo ($I_2$) signals are acquired as gradient-recalled echo signals.

5. The method of claim 3, wherein the $B_1$ map is derived from the voxel-wise intensity ratio of the FID ($I_1$) and stimulated echo ($I_2$) signals.

6. The method of claim 3, further including:
  deriving RF shim settings from the $B_1$ maps.

7. A method of magnetic resonance (MR) imaging comprising:
  subjecting a portion of a body placed in an examination volume of an MR device to a stimulated echo imaging sequence, the stimulated echo sequence including:
    radiating at least two preparation RF pulses (α) toward the portion of the body via at least one RF coil during a preparation period,
    radiating one or more reading RF pulses (β) toward the portion of the body with the at least one RF coil during an acquisition period temporally subsequent to the preparation period,
    applying magnetic field gradient pulses during the preparation and acquisition periods, and
    acquiring one or more FID signals ($I_1$) and one or more stimulated echo signals ($I_2$) acquired during the acquisition period;
  wherein a timing among the preparation and reading RF pulses is selected such that the one or more FID signals ($I_1$) and one or more stimulated echo signals ($I_2$) acquired during the acquisition period have an equal T* weighting;
  subjecting the portion of the body to a navigator sequence comprising one or more navigator RF pulses with the one or more RF coils and switched magnetic field gradients and acquiring navigator signals with the one or more RF coils from the body portion, which navigator sequence is applied at least once before, during or after the stimulated echo imaging sequence;
  deriving motion data from the acquired navigator signals, which motion data reflect motion of the portion of the body;
  deriving at least one $B_1$ map of at least one motion state of the portion of the body indicating a spatial distribution of an RF field of the RF pulses within the portion of the body from the acquired FID ($I_1$) and stimulated echo ($I_2$) signals and the motion data.

8. The method of claim 7, wherein a plurality of $B_1$ maps are derived from the FID ($I_1$) and stimulated echo ($I_2$) signals acquired during repetitions of the stimulated echo sequence and the navigator sequence, each $B_1$ map corresponding to a different one of a plurality of motional states.

9. The method of claim 7, further including:
  determining local specific RF absorption rate (SAR) within the portion of the body from the at least one $B_1$ map.

10. The method of claim 9, further including:
  controlling an amplitude and phase of RF pulses radiated toward the portion of the body in the preparation and acquisition periods to maintain the local specific RF absorption rate below preselected limits.

11. The method of claim 7, further including:
  reconstructing the acquired HD and stimulated echo signals into an image; and
  controlling a display to display the reconstructed image.

12. The method of claim 11, wherein a direct stimulated echo signal (ISTE) and a conjugate stimulated echo signal (ISTE*) are acquired during the acquisition period.

13. The method of claim 12, wherein the direct stimulated echo signal (ISTE) and the conjugate stimulated echo signal (ISTE*) are acquired as gradient-recalled echo signals.

14. A method of magnetic resonance (MR) imaging comprising:
  repeatedly subjecting a portion of a body placed in an examination volume of an MR device to a stimulated echo imaging sequence several times with a repetition time shorter than a longitudinal nuclear relaxation time, the stimulated echo sequence including:
    i) applying, with at least one RF coil, at least two preparation RF pulses (α) to the portion of the body during a preparation period, wherein the at least two preparation RF pulses (α) have a phase difference which is varied with each repetition of the stimulated echo sequence,
    ii) applying, with the at least one RF coil, one or more reading RF pulses (β) to the portion of the body during an acquisition period temporally subsequent to the preparation period,
    iii) switching a gradient magnetic field coil to apply gradient magnetic field pulses to the portion of the body at least during the acquisition period, and
    iv) acquiring, with the at least one RF oil, FID signals ($I_1$) and stimulated echo signals ($I_2$) during the acquisition period;
  wherein the preparation and reading RF pulses are timed such that FID signals ($I_1$) and stimulated echo signals ($I_2$) acquired during the acquisition period are equally $T_2^*$ weighted;
  deriving a $B_1$ map indicating a spatial distribution of an RF field of the RF pulses within the portion of the body from the acquired FID ($I_1$) and stimulated echo ($I_2$) signals.

15. The method of claim 14, wherein a phase difference of the two preparation RF pulses (α) is incremented by a given phase increment with each repetition of the stimulated echo sequence.

16. The method of claim 15, further including:
  reconstructing the acquired FID signals ($I_1$) and stimulated echo signals ($I_2$) into at least one image of the portion of the body; and
  controlling a display device to display the at least one reconstructed image.

17. The method of claim 15, wherein the FID ($I_1$) signals are acquired two or more times as gradient-recalled echo signals at different echo times.

18. The method of claim 17, wherein the stimulated echo signals ($I_1$) are acquired two or more times as gradient-recalled echo signals at different echo times.

19. The method of claim 17, further including:
  separating signal contributions from water spins and signal contributions from fat spins in the FID and/or stimulated echo signals ($I_1$, $I_2$) using a two- or multi-point Dixon technique;
  reconstructing the FID and/or stimulated echo signals into an image of the portion of the body; and
  displaying the image one a display device.

20. A magnetic resonance (MR) device comprising:
  at least one main magnet coil configured to generate a steady magnetic field within an examination volume;
  a plurality of gradient coils configured to generate switched magnetic field gradients in different spatial directions within the examination volume;
  at least one RF coil configured to generate RF pulses within the examination volume and/or to receive MR signals from a body of a patient positioned in the examination volume;
  a control processor configured to control the at least one RF coil and the gradient magnetic field coils to subject the portion of the body to perform a stimulated imaging sequence including repeatedly:
    i) radiating at least two preparation RF pulses (α) toward the portion of the body during a preparation period,
    ii) radiating one or more reading RF pulses (β) toward the portion of the body during an acquisition period temporally subsequent to the preparation period,
    iii) switching the gradient magnetic field coil to apply magnetic field gradient pulses at least during the acquisition period,
    wherein the control processor controls the at least one RF coil and the gradient magnetic field coils such that the RF and gradient magnetic field pulses are timed and scaled to form one or more FID signals ($I_1$) and one or more stimulated echo signals ($I_2$) with equal $T_2^*$ weighting during the acquisition period;
    iv) acquiring one or more FID signals ($I_1$) and one or more stimulated echo signals ($I_2$) during the acquisition period; and
  a reconstruction processor configured to reconstruct a first MR image from the acquired FID signals (I1) and a second MR image from the acquired stimulated echo signals (I2) wherein the control processor is further configured to derive a $B_1$ map indicating a spatial distribution of an RF field of the RF pulses radiated by the at least one RF coil within the portion of the body from a voxel-wise intensity ratio of the first and second MR images.

21. The MR device of claim 20, further including:
  a display device controlled by the control processor to display at least one of an image of the portion of the body and the $B_1$ map.

22. The MR device of claim 20, wherein the control processor is further configured to control the RF and gradient magnetic field coils to apply a navigator sequence, acquire navigator signals indicative of motion of the portion of the body as the portion of the body moves among motion states; and
  wherein the B1 map is derived in at least to one of the motion states from the acquired navigator signals.

23. The MR device of claim 20, wherein the control processor is further configured to control the at least one RF coil to radiate the RF pulses toward the portion of the body several times with a repetition time shorter than a longitudinal nuclear relaxation time and such that the at least two preparation RF pulses have a phase difference which is varied with each repetition of the stimulated echo sequence.

24. A non-transitory computer-readable medium carrying a program configured to be run on one or more processors of a magnetic resonance (MR) imaging device to control the MR imaging device to:
  generate an imaging sequence of RF pulses and switched magnetic field gradients, which imaging sequence is a stimulated echo sequence including:
    i) radiating two preparation RF pulses (α) toward a portion of a body placed in an examination volume of the MR device during a preparation period, and
    ii) radiating a reading RF pulses (β) or a train of reading RF pulses radiated toward the portion of the body during an acquisition period temporally subsequent to the preparation period, wherein the preparation RF pulses (α) and one or more reading RF pulse (β) are timed and have flip angles such that one or more FID signals ($I_1$) and one or more stimulated echo signals form during the acquisition period with equal $T_2^*$ weighting;

acquiring the one or more FID signals ($I_1$) and one or more stimulated echo signals ($I_2$) during the acquisition period; and reconstructing a first MR image from the FID signals ($I_1$) and a second MR image from the stimulated echo signals ($I_2$); and deriving a $B_1$ map from a voxel-wise intensity ratio of the MR images, the $B_1$ map indicating the spatial distribution of the RF field of the RF pulses within the portion of the body.

\* \* \* \* \*